(12) United States Patent
Baecher et al.

(10) Patent No.: US 9,369,263 B1
(45) Date of Patent: Jun. 14, 2016

(54) CALIBRATION OF SAMPLING PHASE AND APERATURE ERRORS IN MULTI-PHASE SAMPLING SYSTEMS

(71) Applicant: International Business Machines Corporation, Armonk, NY (US)

(72) Inventors: Matthew B. Baecher, Rock Tavern, NY (US); John F. Bulzacchelli, Yonkers, NY (US); John F. Ewen, Rochester, NY (US); Gautam Gangasani, Hopewell Junction, NY (US); Mounir Meghelli, I, Tarrytown, NY (US); Matthew J. Paschal, Rochester, NY (US); Trushil N. Shah, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/788,192

(22) Filed: Jun. 30, 2015

(51) Int. Cl.
*H04L 7/00* (2006.01)
*H04L 7/06* (2006.01)
*H04B 17/21* (2015.01)

(52) U.S. Cl.
CPC ............. *H04L 7/0025* (2013.01); *H04B 17/21* (2015.01); *H04L 7/06* (2013.01)

(58) Field of Classification Search
USPC ........... 375/226, 355; 327/115, 175, 158, 146
See application file for complete search history.

(56) References Cited

U.S. PATENT DOCUMENTS

| | | |
|---|---|---|
| 3,943,448 A | 3/1976 | Motley et al. |
| 4,028,626 A | 6/1977 | Motley et al. |
| 4,178,594 A | 12/1979 | Senger |
| 4,263,521 A | 4/1981 | Senger |
| 4,322,643 A | 3/1982 | Preslar |
| 4,475,088 A | 10/1984 | Beard |
| 4,550,292 A | 10/1985 | Smith |
| 4,599,570 A | 7/1986 | Cloke |
| 4,635,097 A | 1/1987 | Tatami |
| 4,675,724 A | 6/1987 | Wagner |
| 5,614,855 A | 3/1997 | Lee et al. |

(Continued)

OTHER PUBLICATIONS

Garlepp et al., "A portable digital DLL for high-speed CMOS interface circuits," Solid-State Circuits, IEEE Journal of (vol. 34 , Issue: 5 ) May 1999.

(Continued)

*Primary Examiner* — Eva Puente
(74) *Attorney, Agent, or Firm* — Scully, Scott, Murphy & Presser, P.C.; Steven Meyers, Esq.

(57) ABSTRACT

Method and apparatus to calibrate sampling phases of a multi-phase sampling system. The method includes on-chip generating a pristine phase reference pattern signal for use in generating at least one reference output signal from a data path; sampling, responsive to a clock signal, the at least one reference output signal to obtain samples; and modifying a phase of the clock signal to align the obtained samples to pattern edges of at least one reference output signal. Both symmetric and asymmetric duty cycle distortion are removed from the pristine phase reference pattern signal input to the data path. The effects of asymmetric distortion in the data path output signal upon the phase calibration are cancelled by periodically inverting the at least one reference output signal. The method adjusts a first phase sampling clock signal output of an electronic phase rotator device to provide an initial alignment setting against a first edge of the reference output signal; and then implements phase calibration logic to align a second phase sampling clock signal against a second edge.

19 Claims, 7 Drawing Sheets

(56) References Cited

U.S. PATENT DOCUMENTS

| | | | |
|---|---|---|---|
| 5,640,060 A | 6/1997 | Dickson | |
| 5,761,073 A | 6/1998 | Dickson | |
| 6,750,725 B2 | 6/2004 | Lee et al. | |
| 7,055,084 B2 | 5/2006 | Bock et al. | |
| 7,256,638 B2 | 8/2007 | Vice | |
| 7,460,610 B2 | 12/2008 | Matsumoto | |
| 7,522,687 B2 | 4/2009 | Cranford, Jr. et al. | |
| 7,551,685 B2 | 6/2009 | Yang et al. | |
| 8,042,010 B2 | 10/2011 | Dartu et al. | |
| 8,054,926 B2 | 11/2011 | Cranford, Jr. et al. | |
| 8,188,766 B1 * | 5/2012 | Cheah | H03L 7/183 326/21 |
| 8,265,181 B2 | 9/2012 | Luong et al. | |
| 8,532,240 B2 | 9/2013 | Tracy et al. | |
| 2004/0161068 A1 * | 8/2004 | Zerbe | G11C 7/22 375/355 |
| 2004/0187045 A1 * | 9/2004 | Butcher | G06F 1/08 713/500 |
| 2008/0152062 A1 * | 6/2008 | Kocaman | H04L 7/033 375/359 |
| 2008/0169853 A1 * | 7/2008 | Park | H03L 7/0812 327/158 |
| 2010/0052744 A1 * | 3/2010 | Fiedler | G06F 1/06 327/146 |
| 2012/0257466 A1 | 10/2012 | Kim et al. | |
| 2014/0091841 A1 * | 4/2014 | Ramaswami | H03K 23/42 327/115 |
| 2014/0266360 A1 * | 9/2014 | Ma | H03K 5/1565 327/175 |
| 2015/0263716 A1 * | 9/2015 | Lin | H03K 3/017 327/175 |
| 2015/0333760 A1 * | 11/2015 | Zerbe | H03K 3/0315 331/25 |

OTHER PUBLICATIONS

Li et al., "Digitally assisted discontinuous conduction mode 5V/100MHz and 10V/45MHz DC-DC boost converters with integrated Schottky diodes in standard 0.13μm CMOS", Solid-State Circuits Conference Digest of Technical Papers (ISSCC), 2010 IEEE International, Date Feb. 7-11, 2010.

Grollitsch et al., "A 1.4psrms-period-jitter TDC-less fractional-N digital PLL with digitally controlled ring oscillator in 65nm CMOS," Solid-State Circuits Conference Digest of Technical Papers (ISSCC), 2010 IEEE International, Date Feb. 7-11, 2010.

Ryu et al.,"Process-Variation-Calibrated Multiphase Delay Locked Loop With a Loop-Embedded Duty Cycle Corrector," Circuits and Systems II: Express Briefs, IEEE Transactions on (vol. 61 , Issue: 1 ) Jan. 2014.

* cited by examiner

CALIBRATION OF SAMPLING PHASE AND APERATURE ERRORS IN MULTI-PHASE SAMPLING SYSTEMS

FIELD OF INVENTION

This disclosure relates generally to electronic circuits providing multi-phase sampling, and more specifically, to a novel system and method to calibrate sampling phase and aperture errors using self-correcting on-chip pattern reference generator in multi-phase sampling systems.

BACKGROUND

The efficiency of the phase and sampling error correction in systems is tied to generation of a reference pattern signal to be used for alignment and correction.

Generating signals providing reference phases to be used for correction is not new. But, in present systems, the reference phases are generated off-chip leading to buildup of reference signal distortions.

Moreover, while duty cycle correction systems are known, and systems that correct for duty cycle distortion, such systems "measure" the distortion and correct for it.

There is a need to generate pristine patterns on-chip for use as a reference to correct for sampling errors.

SUMMARY

A system and method for calibrating sampling phase and aperture errors in multi-phase sampling systems.

The system and method ensures generation of a reference pattern signal of pristine signal quality and use of the pristine pattern to correct for on-chip distortion in output clock signal phases and the sampler aperture errors with high resolution.

In one embodiment, the system and method provides the ability of averaging out asymmetric duty cycle distortion (DCD) by periodically or intermittently inverting the generated reference signal pattern and aligning the samples of the output signal to the reference pattern signal edges before and after signal inversion and taking the average of the two alignments to remove calibration errors due to DCD. This asymmetric DCD could be caused, for example, by voltage offset in the datapath of the pristine reference signal.

Methods are additionally employed to remove both symmetric and asymmetric DCD in a reference pattern generator; and to cancel out the effects of the distortions in the datapath offset induced asymmetric DCD, by converging to one edge before converging to the other inverted edge and taking the average. The act of converging on one edge before converging on another edge of the inverted (flipped) pattern avoids the dead-zone effect.

In one aspect there is provided a system and method of calibrating sampling phases of multi-phase sampling system. The method comprises: generating at least one phase reference pattern signal on-chip by a reference pattern generator circuit; correcting for a duty cycle distortion (DCD) of the at least one on-chip phase reference pattern signal, the at least one DCD corrected on-chip reference pattern signal being input to a data path, the data path providing at least one reference output pattern signal; sampling, using a sampling circuit responsive to a sampling clock signal, the at least one reference output pattern signal to take samples; and modifying a phase of the clock signal to align the samples taken by the sampling circuit of the at least one reference output pattern signal to edges thereof.

In a further aspect, there is provided an apparatus for calibrating sampling phases of multi-phase sampling system. The apparatus comprises: a reference pattern generator circuit for generating, on-chip, at least one phase reference pattern signal; a correction circuit to correct for any duty cycle distortion (DCD) of each the at least one on-chip phase reference pattern signal, the at least one DCD corrected on-chip reference pattern signal being input to a data path, the data path providing at least one reference output pattern signal; a sampling circuit responsive to a sampling clock signal to take samples of the at least one reference output pattern signal; and a processing circuit configured to modify a phase of the sampling clock signal to align the samples of the at least one reference output pattern signal taken by the sampling circuit to pattern edges thereof.

In a further aspect, a computer program product is provided for performing operations. The computer program product includes a storage medium readable by a processing circuit and storing instructions run by the processing circuit for running a method. The method is the same as listed above.

BRIEF DESCRIPTION OF THE DRAWINGS

These and other objects, features and advantages of the present invention will become apparent from the following detailed description of illustrative embodiments thereof, which is to be read in connection with the accompanying drawings, in which.

DETAILED DESCRIPTION

The efficiency of the phase and sampling error correction in clock systems is tied to generation of a pristine e.g., within 250 fs error margin, reference pattern to be used for alignment and correction. A system for generating a pristine signal pattern on-chip and implementing phase and aperture error correction schemes is provided.

In one embodiment, the on-chip scheme implemented may be used in low power signal receiver or transceiver, e.g., a 28 Gbps transceiver with multiphase sampling.

As part of a clock phase and aperture error correction schemes, the system and method provides for: 1) the averaging out asymmetric duty cycle distortion (DCD) by aligning to reference pattern edges before and after signal inversion; 2) removing both symmetric and asymmetric DCD in a reference pattern generator; and 3) in averaging out asymmetric DCD in a datapath while avoiding the dead-zone from contributing to the error.

Figure 1:
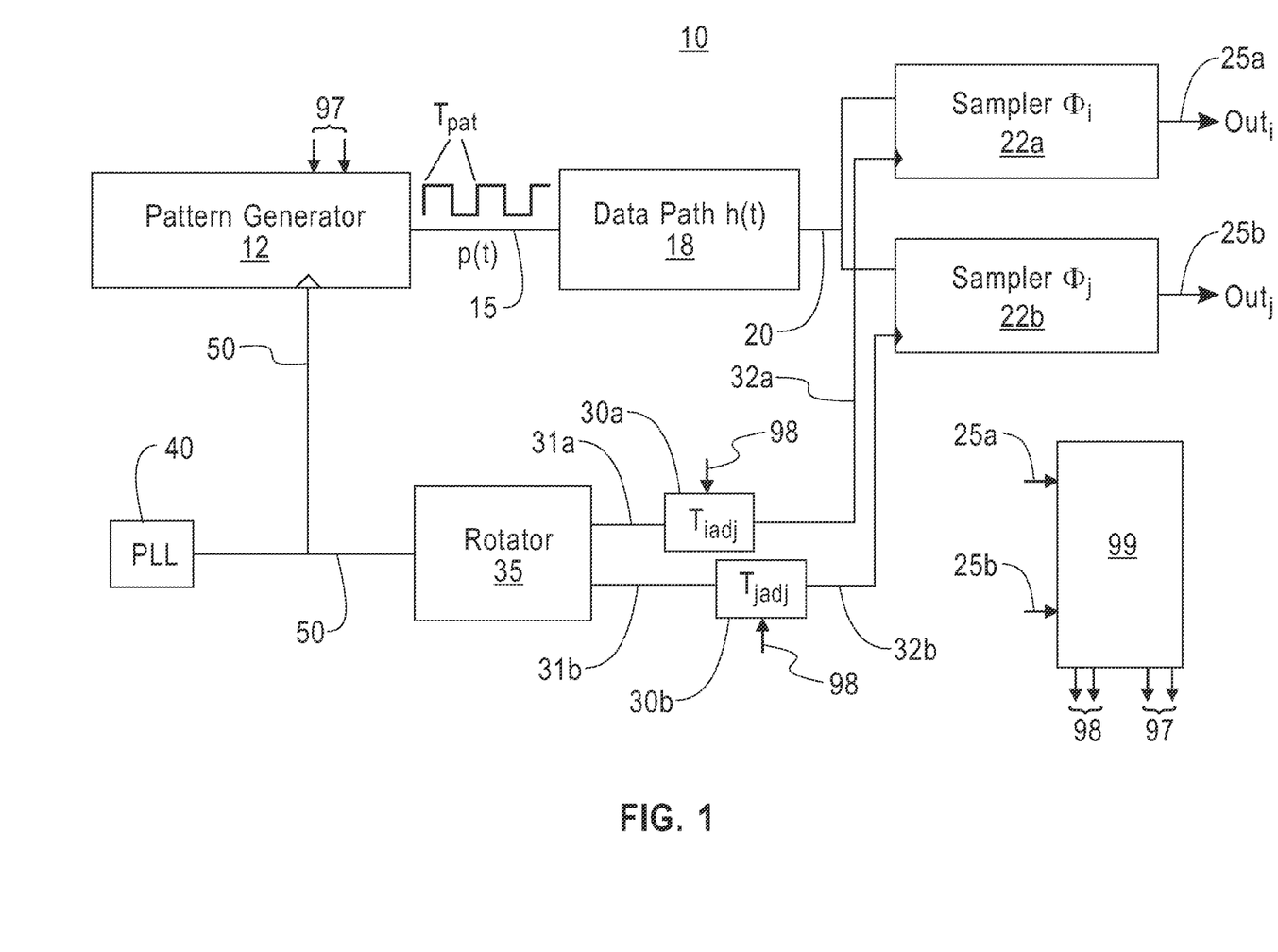
FIG. 1 depicts a general description of the clock correction circuit 10 according to one embodiment.

Reference is had to FIG. 1 showing an on-chip clock generator apparatus 10 providing data sample output signals 25a, 25b. Although two data sample outputs are shown, it is understood that a single data sample or multiple data sample outputs at a variety of frequency and duty cycles may be generated such as for use in the receiver/transceiver chip or integrated circuit. The data sample output signals 25a, 25b may be single-ended or differential signals.

In one embodiment, the apparatus 10 of FIG. 1 provides a clock phase error correction scheme to correct for clock phase and aperture errors that affect the data sample outputs 25a, 25b. In the apparatus 10, a Phase locked Loop (PLL) clock generator provides a ("non-pristine") serial clock reference signal 50. As mentioned, such a signal 50 may include a pair of signals, e.g., differential clock signals (wherein both a clock signal and its complement are generated). The pattern generator macro 12 receives the non-pristine clock signal 50 from PLL 40 and is configured to generate a "pristine" periodic waveform p(t) 15 (a reference pattern signal to be sampled), whose period is programmable. The pristine periodic waveform p(t) generated by the pattern generator 12 propagates over a channel, e.g., a data path which may include an on-chip amplifier chain 18. The on-chip channel or amplifier chain 18 may introduce its own signal non-linearities, e.g., duty cycle distortions (DCD) to the p(t) signal. A distorted pattern reference signal 20 (and its complement) corresponding to the pristine waveform 15 is output of the data path 18 and received at respective signal sampling devices 22a, 22b. The sampling devices 22a, 22b are triggered by a respective clock signal and provide respective sampled outputs $Out_i$ and $Out_j$. It is understood that sampling devices 22a, 22b, which in one embodiment are sample and hold circuits, may introduce further signal distortions to their outputs $Out_i$ and $Out_j$. Sampling devices 22a, 22b sample reference output signal 20 at various phase instances using signals 32a, 32b as described herein below. Each output $Out_i$ and $Out_j$ (e.g., a pattern of 0's or 1's) may be sampled at a particular associated sampling phase, e.g., clock signal phases $\phi_i$ and $\phi_j$, respectively. In one embodiment, the clock signals 32a, 32b that trigger sampling at respective sampling devices 22a, 22b are dynamically adjustable by use of a respective electronic phase rotator device 35 and respective digital-to-analog-converter (dac) devices $T_{iadj}$ 30a and $T_{jadj}$ 30b as will be described herein below. Generally, the clock from the single rotator may be divided down to generate 0, 180, 90 and 270 degree phases. Thus, a single rotator generates the different clock phases to be corrected. Each individual clock phase can be corrected using the Tadj dacs in FIG. 1.

The correction scheme of on-chip pattern generator apparatus 10 is shown in FIG. 1. In one embodiment, the pattern generator circuit 12 provides a pristine pattern 15 and is used to clean up, i.e., correct, the clock phase and any aperture errors introduced at the sampling circuits, and correct for clock phase errors or sampler aperture errors or any other distortions in the output signals $Out_i$ and $Out_j$.

The pattern generator circuit 12 generates a pristine periodic waveform 15, whose period is programmable depending on the phases to be corrected. For example, if the difference between the sample phases, i.e., $\phi_i - \phi_j = 90°$ as opposed to $\phi_i - \phi_j = 180°$ then the period of the pattern generator would halve. In such an embodiment, the pristine pattern generator output signal 15 is generalized according to a formula as follows:

$$p(t) = \sum_{n=0}^{\infty} \left[ u(t - nTpat) - u\left(t - nTpat - \frac{Tpat}{2}\right)\right]$$

where p(t) signal is the repeated pattern generated (e.g., patterns of 1's or 0's) in time t, n is a value of zero to infinity; u( ) is a step function, and Tpat is the period of the desired (pristine) reference pattern signal p(t). In one embodiment Tpat is generated according to:

$$Tpat = 2 \cdot \frac{Ts}{2\pi}(\varphi_i - \varphi_j)$$

where Ts is the sampler clock period (i.e., time period of the sampling clock signal) and, for example, the $\phi_i$, $\phi_j$ are respective clock phase sampling signals with the clock signal $\phi_i$ input to sampler 22a and clock signal $\phi_j$ input to sampler 22b with each at the same given sampling clock period. The differences at the respective sampling circuit signal outputs, i.e., $Out_i$ and $Out_j$ indicates an error of the clocks to each of the sampler (given the pristine pattern signal), or an error in aperture window in different samplers.

The sampled output is as follows:

$$\sum_k \left(Out_x\left(kT_s - \frac{T_s\Phi_x}{2\Pi} - T_{xerror}\right)\right) = \left.\begin{matrix}1\\0\end{matrix}\right\} \begin{matrix}V_{in} > V_{ov}\\V_{in} < V_{ov}\end{matrix}$$

where k is different sampling edges, Vin is input at sample time, Vov is the sampler overdrive needed to output a 1, x=i or j, and $\Phi_x$ is a variable to depict different sampling phases in the system.

If there is an error between outputs ($T_{xerror}$) at the output of the sampling circuits 22a, 22b ($Out_x$) (where x=i or j) due to sampling clock signal phase and sampling inaccuracies, these can be removed by aligning obtained signal $Out_i$ or $Out_j$ taken by the sampler by adjusting a phase rotator device that is the source of both clock phases, for example, to a first edge of the signal 20 at the output of the data path, e.g., aligning to a rising edge of the reference output signal, and by aligning the other phase signal output (e.g., obtained signal $Out_j$ or $Out_i$) taken by the sampler to a falling edge of the signal 20 at the output of the data path by using a sampler clock phase timing adjust dac $T_{jAdj}$ 30b or $T_{iAdj}$ 30a. That is, the clock phases 32a, 32b used for respective sampling circuits 22a, 22b are adjusted so that their samples are aligned with the pristine pattern edges of signal 20.

For example, given an ideal 1, 0, 1, 0, . . . pattern, an error in the outputs $Out_i$ and $Out_j$ is noticed by an on-chip control logic device 99 which would indicate the difference. As the clock samples at $\phi_i$ and $\phi_j$, then logic would detect the difference $Out_i$ and $Out_j$ and indicate a mismatch. To remedy this, in one embodiment, taken clocked samples $Out_i$ of the reference data path output signal are matched, i.e., aligned, to a rising edge of the reference data path output signal 20, and taken clocked samples output $Out_j$ of the reference data path output signal are matched to falling edge signals of the reference data path output signal 20 by adjusting the phase of sampling clocks $\phi_i$ and $\phi_j$ respectively. Thus, clock phase error and sampler errors are adjusted.

Further in view of FIG. 1, in the apparatus, the PLL 40 generated clock signal 50 (e.g., a differential pair in the embodiment depicted) input to the pattern generator 12 is not pristine, i.e., does not have the accurate phase relations between rising and falling edges. This differential pair signal 50 is additionally input to an analog phase rotator 35 (e.g., a single rotator for generating each clock signal) providing respective clock outputs 31a, 31b at different phases and used for positioning the respective sampling function at samplers 22a, 22b that receive the reference signal 20 corresponding to pristine reference signal p(t) generated by the pattern generator 12. For example, the rotator clock output signal 31a functions to position a first clock signal of a first phase $\phi_i$ that forms the sampled data output $Out_i$, e.g., on the rising edge of the reference data path output signal 20, and the rotator clock output signal 31b functions to position a second clock signal of a second phase $\phi_j$ that forms the sampled data output $Out_j$, e.g., on the falling edge of the reference data path output signal 20. If there are no errors in the rotator output clock lines going to the sampler 22a or the sampler 22b (and assuming no mismatch and no aperture errors in the pristine signal) then the respective output signals $Out_i$, $Out_j$ would have an equal number of 1's and 0's (as patterned) as determined by on-chip logic device 99 receiving $Out_i$, $Out_j$ signals 25a, 25b respectively. That is, if the input pattern is pristine, an equal number of 1's and 0's sampled is expected. If there is an error on the clock lines going to the sampler devices, the logic looks to the number of 1's and 0's, with noise, and if one sampler is not sampling correctly, i.e., due to clock error or sampler error or aperture error, a clock phase sampling correction DAC $T_i$adj 30a or $T_j$adj 30b, is adjusted to correct for that. That is, the on-chip logic device 99 performs a phase and sampler error correction algorithm to provide DAC code signals 98 to adjust the sampling edge at both sampler devices 22a, 22b. As shown in FIG. 1, rotator clock output signal 31a is fed to a first correction $T_{iAdj}$ DAC 30a to provide a phase adjusted clock sampling signal 32a as a correction mechanism used to correct the clock aperture errors of sampler 22a; and/or in addition, rotator clock output signal 31b is fed to a respective second correction $T_{jAdj}$ DAC 30b to provide a phase adjusted clock sampling signal 32b as a correction mechanism used to correct the clock aperture errors of sampler 22b. In one embodiment, clock signal $\phi_i$ is tracking the rising edge using phase rotator settings in a "fast" loop. In tandem a slower loop uses the Tadj dacs which change the phase separation between $\phi_i$ and $\phi_j$ to align the phases to the pristine pattern edges.

In one embodiment, the phase sampler adjustment DACs 30a, 30b provide a sampling granularity on the order of, e.g., 100-200 femtosecond resolution, or less, as compared to the rotator 35.

Definitions of Symmetric and Asymmetric Duty-Cycle Distortion

Figure 2:
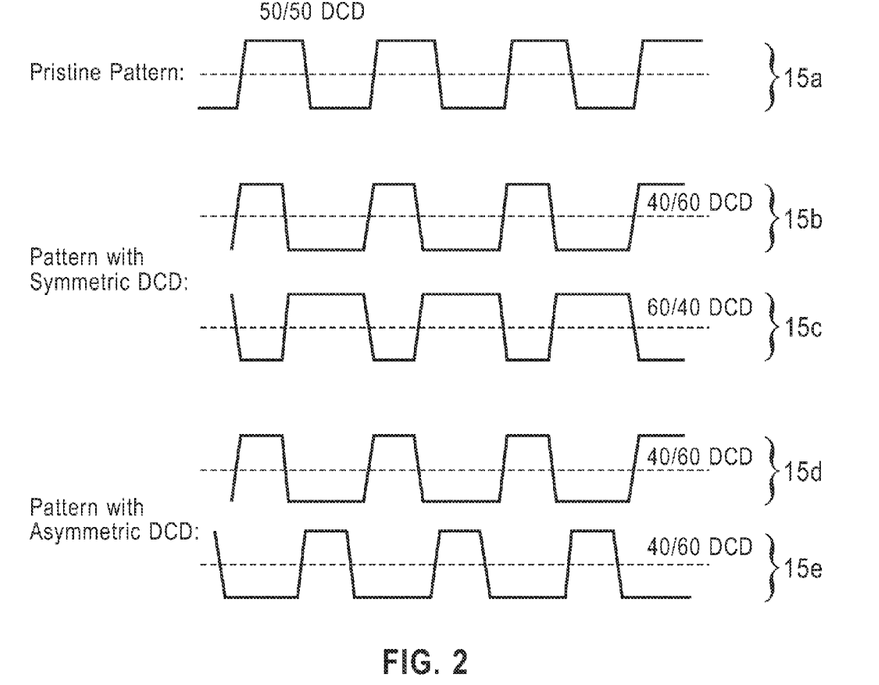
FIG. 2 depicts example instances of symmetric and asymmetric duty-cycle distortion in a pattern generator, and their effect on the net residual error in one embodiment.

FIG. 2 depicts example symmetric and asymmetric duty-cycle distortion in the pattern generator, and their effect on a net residual error.

There are several types of duty-cycle distortion. Types of duty-cycle distortion of the pattern reference signal output of the data path into the sampler 22a, 22b may include symmetric or asymmetric sources of distortion. The pattern of a generated signal 15a shown in FIG. 2 is pristine with no distortion and no edge movement with a pattern flip.

Symmetric duty cycle distortion depicted as signals 15b, 15c in FIG. 2 does not lead to edge transition movement with a pattern flip. Hence while aligning to the pattern edges to correct for phase and sampling errors, this type of distortion may lead to an increase in residual error term.

Asymmetric duty-cycle distortion depicted as signals 15d, 15e in FIG. 2, leads to movement in transition edges with the pattern flip, which leads to a different alignment position. The edges have moved between the 15d, 15e in this type of distortion. By averaging the converged alignment positions from samples of both before and after the pattern flip, the effects of asymmetric duty-cycle distortion in the pattern could be removed from becoming a residual error term in phase and sampler error alignment algorithm.

Periodic Pattern Flipping

In one embodiment, an algorithm is implemented for controlling the operations of the pattern generator circuit 12 and particularly pattern "flipping". The algorithm periodically flips the input signal pattern. For example, a signal of 111 . . . 11000 . . . 00 may be flipped to 000 . . . 00111 . . . 11. Pattern flipping is advantageous for the following reasons:

1. Periodic pattern flipping prevents pattern dependent body bias from building up in the floating body devices of the data path. If left unchecked this body bias induced offset would cause duty-cycle distortion (DCD) in the pattern and lead to residual errors in the correction.

Figure 3:
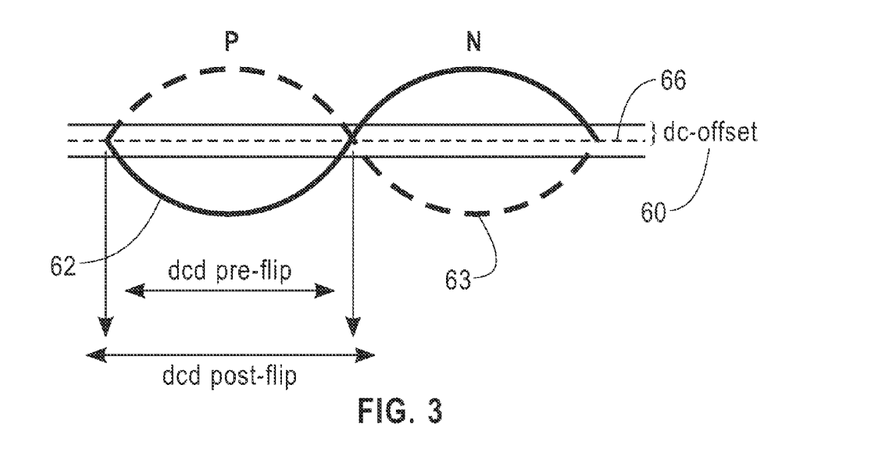
FIG. 3 shows how residual dc-offset in the data path could lead to asymmetric duty-cycle distortion.

2. FIG. 3, shows how residual dc offset in the data path 18 could lead to asymmetric duty-cycle distortion. Even though a dc-offset 60 of the data path 18 and the sampling latches is calibrated out, there may be duty-cycle distortion left over due to offset digital-to-analog conversion (dac) quantization errors, and due to the fact that null-ing dc-offset does not guarantee full removal of duty-cycle distortion in the path. By taking sampler output from both pre-flipped DCD 62 and post-flipped DCD 63 patterns, the error alignment algorithm cancels the effect of asymmetric duty-cycle distortion such as would be present by signals 15d, 15e of FIG. 2.

In one embodiment, the input clock signal pattern is flipped intermittently or every "x" samples, e.g., 5 samples, to average out residual distortion. In one embodiment, the input clock signal pattern is flipped periodically, e.g., every 10 nsec, or for so long as to prevent body buildup in floating body transistor devices in the data path. As shown in FIG. 1, the on-chip logic device 99 is programmed to provide signals 97 used to control the pattern flipping.

Duty-Cycle Correction

Figure 4:
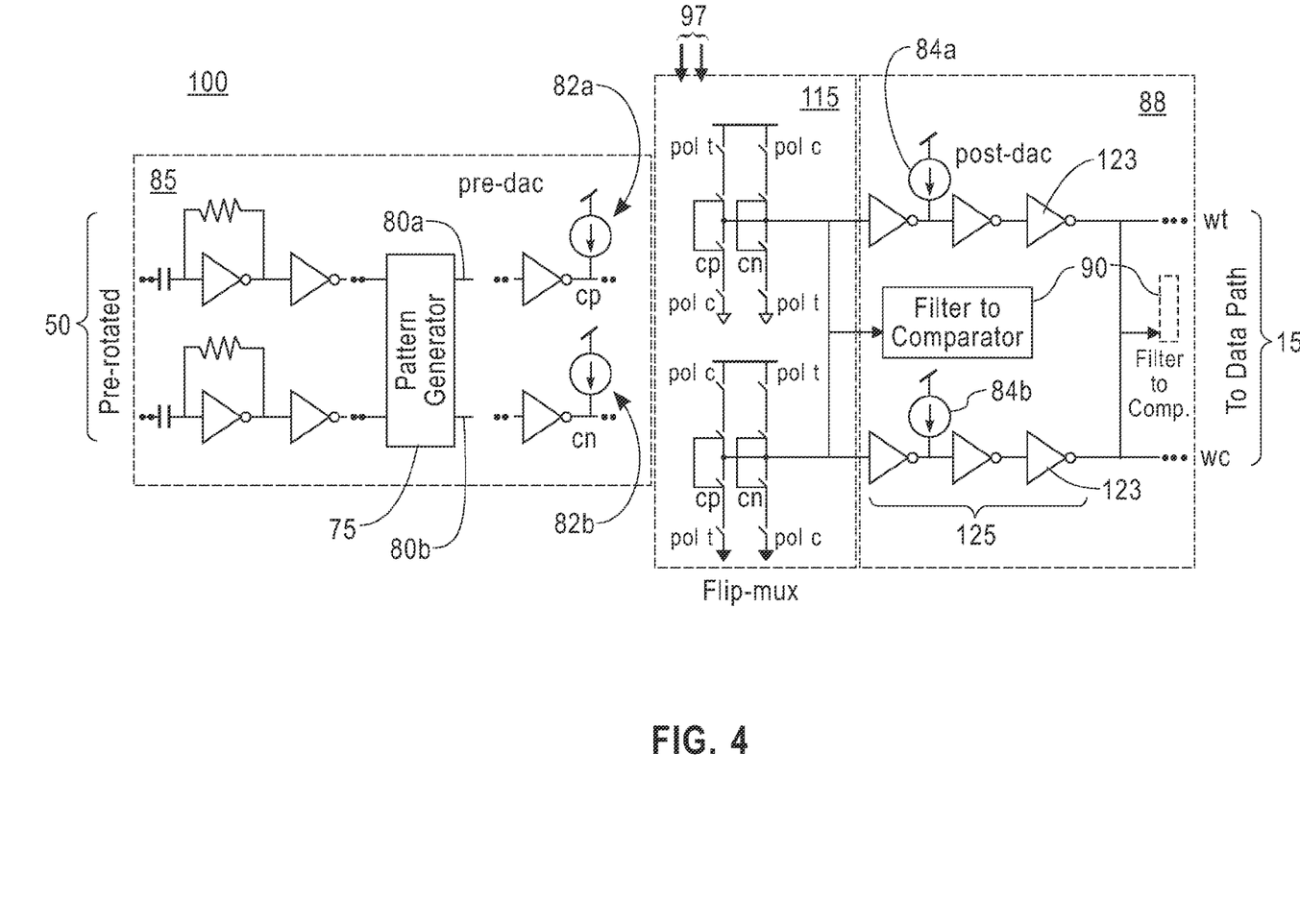
FIG. 4 shows the general topology of the pattern generator in one embodiment.

FIG. 4 shows the general topology 100 of the (pristine) pattern generator circuit 12. The pattern generator circuit includes a pre-DAC circuit (pre-flip) stage 85 where cp and cn are the differential generated output clock signals from the pre-flip stage 85, and wt and wc signals are corresponding error-corrected signals to the data path. In one embodiment, cp and cn signal distortions are cleaned to correct symmetric DCD using a pre-flip-mux correction dac (pre-dacs) 82a and 82b, respectively.

The respective outputs of post-DAC devices 84a, 84b of (post-flip) stage 88 provide the wt and wc signal outputs with symmetric and asymmetric DCD removed. The wt and wc signals become the DCD corrected (pristine) signal outputs 15 input to the data path 18. As the flip-mux 115 generates symmetric distortion, an algorithm is used to correct each of the pre-dac 82a, 82b and each of post-dac 84a, 84b stages to correct for both asymmetric and symmetric DCD.

More particularly, in the pattern generator circuit topology 100 of FIG. 4, the pre-rotated clock signal 50 is input and the pattern generator macro 75 is used to generate requisite pattern signal 80a and its complement (differential) signal 80b which are input to pre-flip dac (pre-dac) elements 82a, 82b along respective differential clock paths for carrying signals into a flip multiplexor or "flip-mux" circuit 115. As shown, pre-dac circuit 82a provides a "cp" reference pattern signal of the differential pair and pre-dac circuit 82b provides a "cn" reference pattern signal of the differential pair. The flip-mux circuit 115 receives the cp and cn reference pattern signals as shown, and flip-mux circuit 115 is programmed using signals 97 to control the pattern flipping via switches labeled "pol c" and "pol t" in FIG. 4 to periodically flip the pattern at a determined period, e.g., every 10 nsec. For example, in flip multiplexer 115, the controlled activating of polarity switches pol c or pol t will flip the pattern of both pre-dac stage output signals cp and cn. After pattern flipping by the flip-mux circuit 115 there are one or more driving stages 125 including buffers 123 to drive the data into the data path 18 (peak amplifier input) as pristine differential signals 15 (as shown in FIG. 1). It is noted regarding duty-cycle distortions in this topology 100 that:

1. The duty-cycle distortion prior to the flip-mux processing leads to symmetric duty-cycle distortion after pattern flip when observing at a node (of a tree) after the flip-mux processing. For example, if distortion is 40% prior to pattern flip, after a pattern flip it becomes 60%.
2. Duty-cycle distortion due to buffers 123 after the processing at flip-mux circuit 115 does not change value after pattern flip, hence is of asymmetric nature.

Further in FIG. 4, output signals wt and wc corresponding to cp and cn pattern signals, respectively, are repeating signals having respective complementary high or low depending upon the cp and cn signal pattern. Both these signals wt and wc are input to a low-pass filter and comparator combination 90, wherein the low-pass filter generates an average value of wt and wc signals, e.g., average value vp and the average value vn, respectively. With no DCD (distortion), signals vp and vn would be equal. Otherwise, these signals are input to a comparator element of circuit 90 and, if vp is greater than vn this indicates a comparator output is a one (1), and the pre-dac stages 82a or 82b are corrected in one way; however, if vp is less than vn this indicates a comparator output is a zero, and the pre-dac stages 82a or 82b are corrected in another way (pre-dac DCD correction) to correct symmetric DCD.

Generally, with respect to pre-dac symmetric DCD correction, in one embodiment, the following steps are implemented: 1) Sensing low pass filter output in circuit 90 right after the flip mux; obtaining $V_{pavg} - V_{navg}$ through a comparator output; and Inc/dec pre-dacs 82a, 82b to clear out this error, and let the converged dac code be predac1. For example, 40% duty cycle would lead to dac value increase to correct for it (e.g., to bring duty cycle back to 50%). 2) Next, resetting dac code and flipping the pattern through the flip-mux and sensing the low pass filter output of circuit 90 right after the flip-mux; obtaining $V_{pavg} - V_{navg}$, through a comparator output; and Inc/dec pre-dac 82a, 82b to clear out this error and let the converged dac code be predac$_2$. For example, a 40% duty cycle would have become 60% duty cycle post flip. But, as the comparator output is inverted in logic, pre-dac is still increased to bring the duty cycle back to 50%. Then, 3) taking an average of predac$_1$ and predac$_2$ as the pre-dac setting code for pre-dacs 82a, 82b. In theory, the flip mux output (where the low pass filter senses the DCD) is mostly dominated by symmetric distortion, in which case the divergence in these dac values before and after pattern flip would be minimal.

Referring back to FIG. 4, generally, post-dac stage 88 corrects any distortion out of the flip-mux 115. With respect to post-dac asymmetric DCD correction, which is mostly due to distortion in the tree after the flip-mux, post-dac is used with a filter sense point at the wrap mux in the data path. In one embodiment, the asymmetric post-dac correction includes using an average of the post-dac values before and after the flipping as the final setting for the post-dacs 84a, 84b. The duty cycle distortion due to asymmetric distortion remains constant with the pattern flip, hence a filter/comparator circuit 90 output is not inverted after the pattern flip in this case.

Figure 4A:
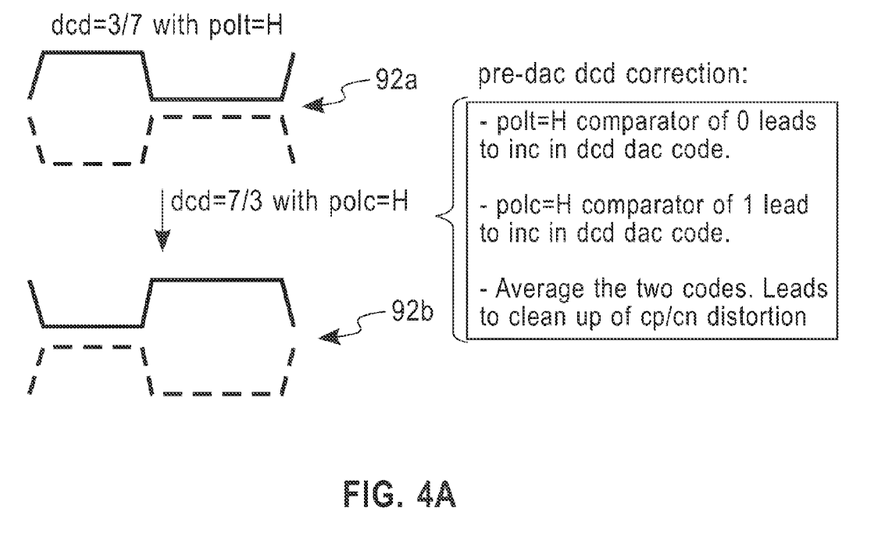
FIG. 4A shows an example for correcting symmetric duty-cycle distortion in the pattern generator in one embodiment.
Figure 4B:
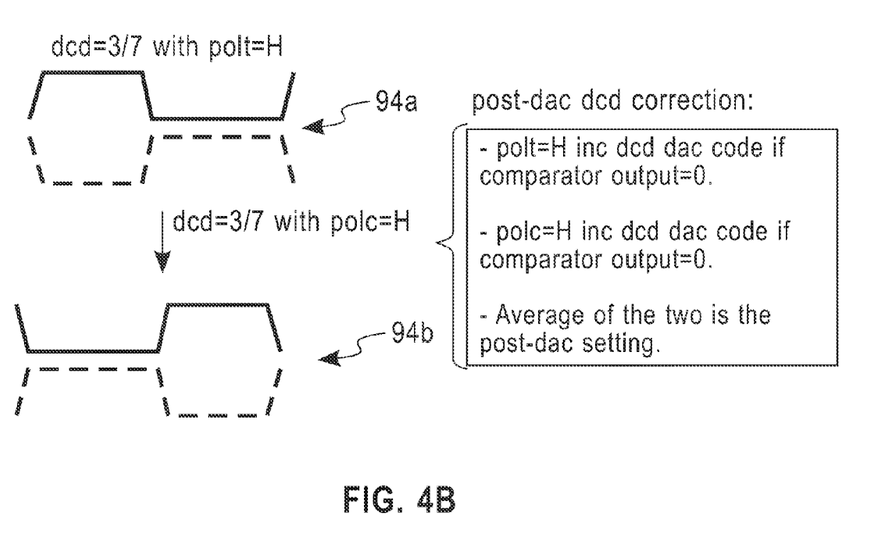
FIG. 4B shows an example for correcting asymmetric duty-cycle distortion in the pattern generator in one embodiment.

FIG. 4A is illustrative of the pre-dac duty cycle correction in pre-flip-mux stage 85 (of FIG. 4) and FIG. 4B which shows post-dac duty cycle correction in post-flip-mux stage 88 (of FIG. 4). Pre-dac section 85 corrects symmetric DCD (i.e., cn and cp signals). If comparator is zero, they are corrected one way. Once flipped the comparator is checked and the average of two leads to symmetric DCD being corrected.

For example, in the pattern generator topology 100, the input differential clock signals cp and cn are input to the flip clocks in the flip mux 115 that flips polarity of the input clock signals (differential clock signals), e.g., using programmed switches pol c or pol t. These switches in the flip-mux 115 are used to control differential clock signal polarity, i.e., controlling when the polarity of the output signal level 0 flipping to a 1, or output signal level 1 flipping to a 0 occurs. For correcting pre-DAC DCD, in a non-limiting example, pre-DAC signals 92a show a DCD=3/7 signal pattern and its pre-DAC complement (i.e., signals cp and cn) when switches pol t are set high, e.g., pol t=H. As a non-limiting example, signals 92b show output signals after signal flipping in flip-mux 115, i.e., post-DAC having a DCD=7/3 signal pattern and its post-DAC (DCD=7/3) complement when pol c set high, e.g., pol c=H.

More particularly, for pre-DAC symmetric DCD correction, at the output of the flip-mux, with the switches pol t=H indicating the differential clock signal polarity, and using filter and comparator circuit 90, if the comparator output is "0" then this indicates a symmetric DCD of signals 92a; and an adjustment, e.g., increase, in a DCD (digital-analog-converter) DAC correction code at pre-dac circuits 82a, 82b. Similarly, in FIG. 4A, after signal pattern flip, for pre-DAC DCD correction, at the output of flip-mux, with switches pol c=H indicating the differential clock signal polarity, and using filter and comparator circuit 90, if the comparator output is "1" then this indicates a symmetric DCD of signals 92b, and an adjustment, e.g., increase, in DCD DAC correction code at pre-dac circuits 82a, 82b. As mentioned, for pre-dac symmetric DCD correction, an averaging of the two codes leads to a correcting of the cp/cn symmetric DCD signal distortion.

Post-dac DCD signal correction is performed similarly as the pre-dac DCD correction. For example, both $V_{pavg}$ and $V_{navg}$ (of the pair) are taken at the post-dac devices 84a, 84b for the non-inverted signal after the flip mux (input differential signal pair not inverted). These are compared and dcd corrected to get a first post-dac value. Then, both $V_{pavg}$ and $V_{navg}$ are taken after the flip mux after signal inversion (i.e., after pattern flipping). These are further compared and dcd corrected to get a second post-dac value. Then, the first and second post-dac values are averaged and used as the post-dac settings.

As an example for correcting post-DAC DCD, in a non-limiting example, post-DAC signals 94a show a DCD=3/7 signal pattern and its post-DAC complement when switches pol t are set high, e.g., pol t=H. As a non-limiting example, signals 94b show output signals after signal flipping in flip-mux 115, i.e., post-dac stage having a DCD=3/7 signal pattern and its post-DAC stage complement when pol c set high, e.g., pol c=H.

For post-DAC DCD correction, at the output of the flip-mux at post-dacs 84a, 84b, with the output of pol t=H, if a comparator output is "0" then an increase in DCD DAC correction code (i.e., post flip-mux) will correct the distortion; similarly, with the output of pol c=H, if a comparator output is "0" then this leads to an increase in DCD DAC correction code (after flip mux) to correct the distortion. Averaging of the two codes leads to the post-DAC setting to correct for DCD distortion.

It should be understood that, both pre-dac and post-dac adjustments are needed to generate the clean (pristine) reference pattern, only if the reference pattern is flipped by flip-multiplexor device. If there is no flipping the reference pattern, then no flip-mux would be needed and no pre-dac and post-dac would be needed. All that would be needed in that case is to sense the distortion and correct for it with a single dac.

Figure 5:
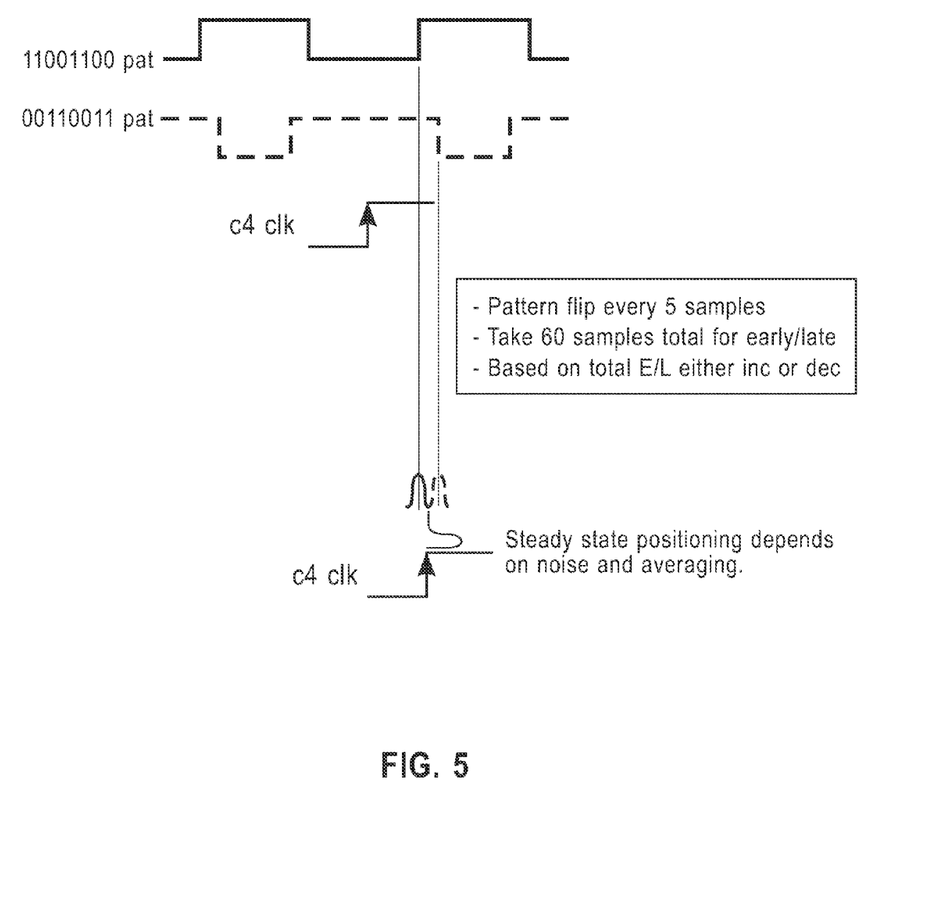
FIG. 5 shows an edge alignment with pattern flipping, asymmetric DCD, noise and dead-zone.

FIG. 5 conceptually shows edge alignment issues with pattern flipping, asymmetric DCD, noise and dead-zone; and particularly, how distortion due to asymmetric duty-cycle distortion is removed by converging on an optimal point in the presence of noise. In case the distortion is larger than the noise span, then the way to avoid a dead-zone includes repeating the flipping of the pattern but taking samples from only one type of pattern till convergence is achieved before doing the same to the flipped pattern, and then taking the average of the two converged values. For example, an embodiment includes flipping the pattern periodically, e.g., every 5 samples, and taking samples of one edge to determine whether the sampling of the pattern is early or late. Based on the total early or late values, then the DAC codes will be either incremented or decremented. The pattern is intermittently flipped to avoid build up of history effect. One phase and aperture correction is performed on only one type of pattern (inverted or non-inverted) at any point in time. Once the correction algorithm converges on the edge it focuses on the other flipped pattern and converges on that edge. The average of the two is then used as final correction value. By focusing on only one edge, the algorithm avoids the pitfalls on the dead-zone that may occur when a clock phase correction convergence occurs in an early or late timing region near a pattern edge during a pattern signal inversion.

Phase and Sampler Error Correction Algorithm

As mentioned with respect to FIG. 1, each sampler device 22a, 22b is clocked with a respective clock signal 32a, 32b respectively, with sampler $\phi_i$ 22a receiving clock signal 32a for obtaining a phase sample output 25a from output reference signal 20; and with sampler $\phi_j$ 22b receiving clock signal 32b for obtaining a phase sample output 25b from output reference signal 20. In one embodiment, first sampling phase adjustments for sampler devices 22a and 22b are made via respective clock signals 31a, 31b generated by the rotator device 35 in response to clock reference signal 50 generated by the PLL 40 and received at the rotator 35. These rotator step signals provide a respective signal phase adjustment of the generated clock signals for input to samplers 22a, 22b. In one embodiment, a further sampling phase adjustment is achieved using timing correction digital-to-analog-converter (dac) circuits $T_{iAdj}$ dac 30a and $T_{jAdj}$ dac 30b that provide respective correction sampling signals 32a and 32b responsive to adjust signals output from logic device 99 for adjusting timing of the clock signal sampling at respective signal sampling devices 22a, 22b. As described in greater detail herein below, a phase rotator device setting is first adjusted to modify a phase of a first sampling clock signal to align its samples to the edges of the reference output pattern signal. Concurrently, one of the $T_{iAdj}$ or the $T_{jAdj}$ DAC device settings is adjusted to modify a phase difference between the two sampling clock signals, by aligning said second sampling clock signal to a different edge of the reference output pattern signal.

Figure 6A:
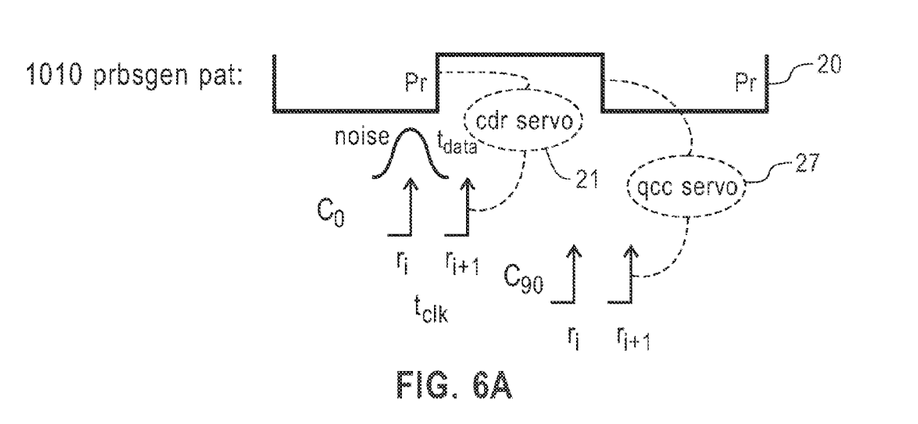
FIG. 6A depicts results of a clock data recovery servo-loop and phase algorithm operating in tandem with a phase calibration servo loop (QCC) applied for clock calibration during phase and sampler error calibration based on a pattern reference.
Figure 6B:
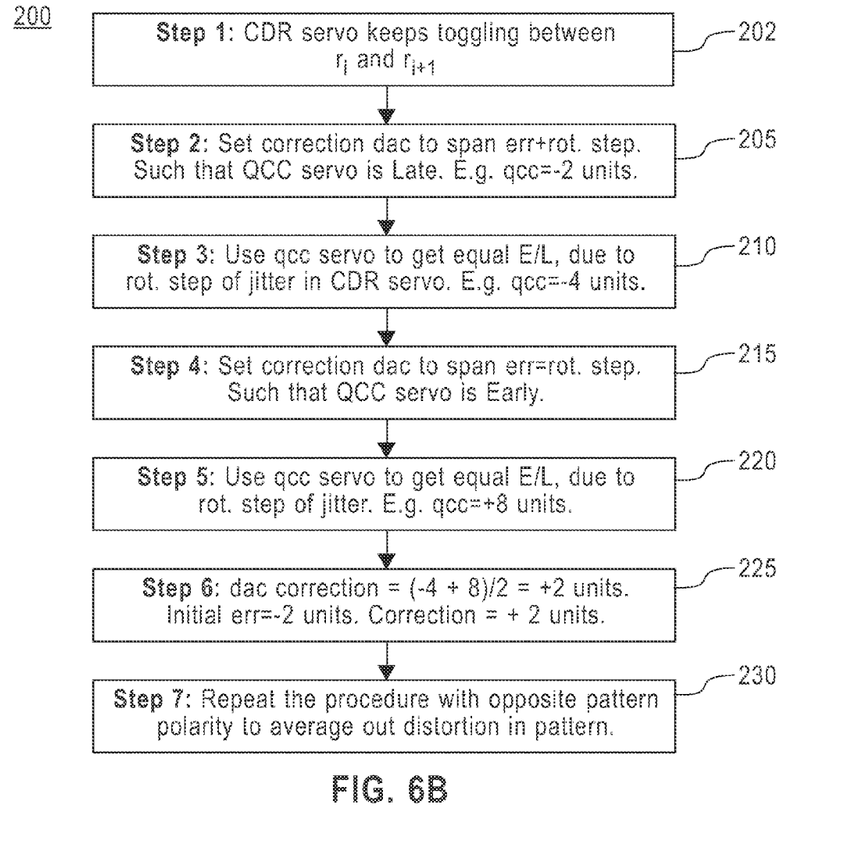
FIG. 6B shows details of the calibration algorithm employed during phase and sampler error calibration based on a pattern reference.

FIGS. 6A and 6B show details of a calibration algorithm for phase and sampler error calibration based on a pattern reference. Generally, as shown in FIG. 6A, a first calibration algorithm 200 is first performed by the on-chip logic device 99 of FIG. 1. In one embodiment, the processing depicted in FIG. 6A assumes that a clock data recovery (CDR) loop (e.g., a processor implementing clock data recovery logic) providing a sampling clock via the phase rotator operates much faster than the clock "phase correction" loop that is running phase calibration logic in tandem. For example, in one embodiment, a CDR loop processing invokes processor logic employed to set a phase rotator setting to lock clock samples based on one signal phase, e.g., a phase $\phi_i$. In tandem, a clock phase calibration logic is implemented, e.g., by sampling a further clock signal phase, e.g., phase $\phi_j$, and comparing the edge samples and the data samples to make an "early" or "late" determination according to the calibration algorithm logic. The clock phase calibration logic is implemented to generate a correction signal for further adjusting the phase (of the sampling clock) via a phase adjustment dac circuit $T_{iAdj}$ dac 30a or $T_{jAdj}$ dac 30b. In one embodiment, clock phase correction loops are the quadrature cycle correction loop and duty cycle correction loop for the system. In FIG. 1, this processing loop invokes processor logic employed to adjust the Tadj elements to correct for the clock phase errors. Thus, for example, in a CDR servo loop calibration step, the sampler outputs (from different clock phase triggers) are used to align particular clock phases to data pattern edges. For example, if a C45 phase sampler nominally is sampling the data edges, then the sampler outputs from C90 and C0 can be used to determine whether C45 sample is early or late with respect to the data edge, and thus positioning the rotator appropriately to get 50% early and late from C45 sampler.

In view of FIG. 6A, the CDR loop processing logic invokes elements for performing a rotator calibration, wherein the FIG. 6A, the clock phase C0 is locked to a pristine pattern (reference output) signal 20, e.g., locked to a "1, 0, 1, 0, 1, 0 . . ." repeating pattern's rising edge $P_r$, using the single rotator 35 to move a respective sampling clock signal by a step in the CDR servo loop 21.

In FIG. 6A, the logic implemented by the clock data recovery (CDR) loop 21 takes the samples (indicated as the upward pointing arrows) from particular clock phases, e.g., clocks C0, C45, C45-quarters, to determine whether the position of a clock phase, e.g., clock of 0° phase or C0, is early or late ((e.g., with respect to a zero-crossing). Depending on that determination, the rotator 35 is adjusted early or late. The indicated rotator positions r(i) or r(i+1) is the granularity for a first rotator calibration setting. In steady state operation, the phase rotator device 35 might toggle back and forth between these two settings. The CDR loop is the faster loop when run in tandem with clock phase correction; there is a much slower loop run by phase calibration logic to correct for clock quadrature error, i.e., QCC or quadrature clock correction 27, or duty cycle error, i.e., DCC or duty cycle clock correction.

In one embodiment, the setting of a phase rotator device to modify a first phase of a sampling clock signal to align its samples to the edges of the reference pattern signal is adjusted concurrently with the adjusting of the setting of said DAC device to align a second phase sample of the sampling clock to a different edge of the reference output signal.

Thus, the clock data recovery servo loop 21 that aligns a sampling clock, e.g., a C0 sampler clock, to data edges, is a faster loop processing, and in tandem, there is slower running phase calibration loop used to correct phase errors between C0 and C90 phase (quadrature error) and between C0 and C180 phases (duty cycle errors) of the sampling clock. The clock phase correction loop is a "slower" loop, working in tandem with the faster CDR loop. If quadrature phase is being corrected, then the C90 clock samples are used for the same 1, 0, 1, 0, 1, . . . pattern. If the duty-cycle is being corrected, then the C180 clock phase is used to sample the same 1, 0, 1, 0, 1, . . . reference pattern. In one case C0 and C90 are tracking the duty cycle of the pristine pattern, and in case of C0 to C180 correction, they are tracking the period of the pristine pattern. The Tadj dac changes the IQ phase (and duty cycle distortion) of the clocks. Thus, for example, if C0 is tracked through phase rotator adjust, then Tadj will update difference between C0 and C90 (or C0 and C180) while doing calibration correction.

During the calibrating, the processor of the CDR loop is configured to align one phase of a sampler output to reference output signal edges based on phase rotator device settings; and concurrently phase calibration logic is implemented to align, using a slower clock correction loop, a different phase sampler output to the reference output signal but at different edges using a sampling clock phase calibration (i.e., timing dac) adjustment. Generally, during this CDR loop calibration setting using the phase rotator, another clock phase sampling output is employed by the clock calibration logic to align the sampling clock to the data edges using the timing dacs. By the CDR loop tracking and aligning one clock phase sampler output to the data edges at the faster rate, while aligning another clock phase sampler output to another set of data edges at a slower rate, a delta phase error between the two sampler outputs is corrected.

Figure 6C:
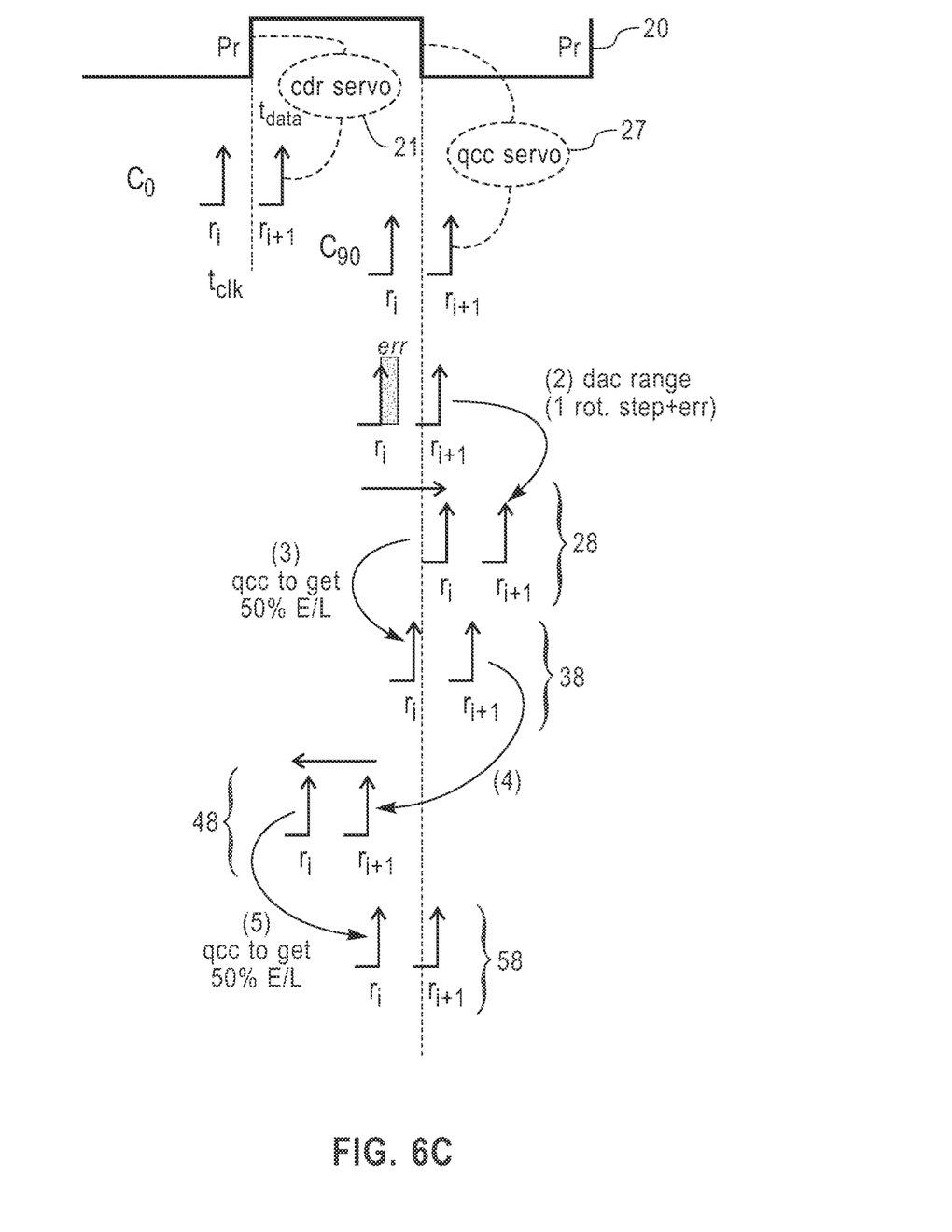
FIG. 6C depicts results of operations performed at certain steps of the algorithm of FIG. 6B.

FIG. 6B shows details of an algorithm 200 employed by the CDR loop adjustment algorithm and the phase calibration logic algorithm during phase and sampler error calibration based on a pattern reference. Initially, the calibrations are directed to computations for a non-inverting reference output signal pattern; however, the polarity of the reference output signal pattern is inverted for further calibrations processing. FIG. 6C particularly depicts results of operations performed at certain steps of the algorithm 200 of FIG. 6B for the case of a non-inverting reference output signal pattern 20.

Generally, as shown in FIG. 6B, there is depicted a first step 202 of determining a toggling condition, where, due to the faster CDR servo loop, the CDR servo loop keeps toggling between rotator positions r(i) or r(i+1). Then, at 205, the algorithm performs steps that remove any error in clock phase, e.g., a value "err" in C0-C90 clock phases. At 205, specifically, a $T_{jAdj}$ DAC 30A or 30B (depending upon what phase one is correcting) is set with a code 98 that spans the error plus the rotator step such that the clock phase calibration (e.g., QCC) servo loop 27 becomes late. In one example embodiment depicted, the lateness error is 2 units. This step entails "railing" the Tadj DAC 30A or 30B (e.g., either for quadrature correction or for duty cycle correction depending what phase one is correcting) such that the clock phase being corrected gives all early or lates, i.e., the clock phase correction loop detects all ones (1's) or all zeros (0's). In an example application of the algorithm, the clock phase calibration QCC adjustment is made for the 90° phase clock sampler, e.g., C90 sampler, to output all lates or majority lates, as depicted as samples 28 as shown in FIG. 6C.

Next, at 210, FIG. 6B, the algorithm employs the clock phase calibration QCC servo loop 27 to adjust the Tadj correction DAC to obtain an equal number of early and lates from the phase clock sampler output. In an example application of the algorithm, a QCC adjustment is made for the 90° phase clock sampler output, e.g., C90 sampler, to output an equal number of early and lates, i.e., the clock phase correction loop detects an equal number (e.g., 50%) of zeros (0's) and ones (1's) as the input pattern is pristine, as depicted as samples 38 as shown in FIG. 6C. In the embodiment of the algorithm 200 depicted in FIG. 6B, the QCC adjustment may amount to 4 units, for example. It is noted that this Tadj position is recorded by the processor device or CDR logic controller as a "Tadj1" value.

Next, at 215, FIG. 6B, the algorithm employs the QCC servo loop 27 to adjust the Tadj correction DAC such that the 90° phase clock sampler output, e.g., C90 sampler output, is all early (in this example) with respect to the relevant data edge, e.g., edge $P_r$. In this embodiment, logic is implemented such that the clock phase correction loop detects an opposite condition of one of: all ones (1's) or all zeros (0's). In the embodiment of the algorithm 200 depicted in FIG. 6B, the QCC adjustment may amount to 8 units, for example. The output of all early samples is depicted as samples 48 as shown in FIG. 6C.

Next, at 220, FIG. 6B, the algorithm employs the QCC servo loop 27 to adjust the Tadj correction DAC to again obtain 50% early or late samples from C90 sampler output. In the example application of the algorithm, a QCC adjustment is made for the 90° phase clock sampler output, e.g., C90 sampler, to output an equal number of early and lates, as depicted as samples 58 as shown in FIG. 6C. It is noted that this Tadj position is recorded by the processor device or CDR logic controller as a "Tadj2" value.

Next, at step 225, FIG. 6B, the algorithm employs computing an average of Tadj1 and Tadj2 adjustment values recorded.

Finally, as indicated at step 230, FIG. 6B, the algorithm steps 202-225 are repeated with the reference output signal pattern of inverted polarity. Then, in a subsequent step (not shown), there is computed the average of the final values with inverted and non-inverted patterns. The average of the final $T_{Adj}$ DAC values with inverted and non-inverted patterns is used as the final Tadj value for the clock phase correction. It is understood that the algorithm 200 depicted in FIG. 6B can be used to correct for errors in C0-C90 (quadrature error) or C0-C180 (duty cycle errors).

Thus, returning to FIG. 1, once a pristine waveform is being produced by the data pattern generator 12 (with very low duty-cycle error), the edges in this waveform provided as corresponding reference signal 20 output of the data path are used to compare the phases of the different clocks (and apply the desired corrections when necessary). To do this, it is necessary to move the clock positions until they line up with the edges of the reference output signal 20 corresponding to the pristine waveform as shown in FIGS. 6A and 6B. This alignment is checked by seeing whether the latch driven by the clock is sampling the zero-crossing, which is marked by about 50% ones and zeros in the latch output.

The present invention may be a system, a method, and/or a computer program product. The computer program product may include a computer readable storage medium (or media) having computer readable program instructions thereon for causing a processor, e.g., the on-chip processor device 99 of FIG. 1, to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While various embodiments are described herein, it will be appreciated from the specification that various combinations of elements, variations or improvements therein may be made by those skilled in the art, and are within the scope of the invention. In addition, many modifications may be made to adapt a particular situation or material to the teachings of the invention without departing from essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of calibrating sampling phases of a multi-phase sampling system, the method comprising:
   generating at least one phase reference pattern signal on-chip by a reference pattern generator circuit;
   correcting for a duty cycle distortion (DCD) of said at least one on-chip phase reference pattern signal, said at least one DCD corrected on-chip reference pattern signal being input to a data path, said data path providing at least one reference output pattern signal;
   sampling, using a sampling circuit responsive to a sampling clock signal, said at least one reference output pattern signal to take samples; and modifying a phase of said clock signal to align the samples taken by said sampling circuit of said at least one reference output pattern signal to edges thereof.

2. The method of claim 1, further comprising:
periodically inverting the on-chip generated phase reference pattern signal within the reference pattern generator circuit, and performing a clock phase correction before and after the inverting with averaging phase correction result values to cancel out errors due to a duty cycle distortion (DCD) in the at least one reference output pattern signal.

3. The method of claim 2, wherein performing the clock phase correction comprises:
detecting a convergence to a first pattern edge to obtain a first phase correction result value prior to said reference pattern signal inverting, and
detecting a second convergence to an inverted version of the first pattern edge to obtain a second phase correction result value after said reference pattern signal inverting; and
averaging said first and second phase correction result values.

4. The method of claim 1, further comprising:
outputting the sampling clock signal from an electronic phase rotator device for said sampling said at least one reference output pattern signal from said data path, said modifying including:
determining whether a latch of the sampling circuit is sampling before or after a zero-crossing; and, in response to said determining,
adjusting, using a phase calibration logic, a phase sampling calibration of said sampling clock signal to align its sample to the zero crossing.

5. The method of claim 4, wherein said adjusting phase sampling calibration of said sampling clock signal comprises:
controlling, using a processor device configured with said phase calibration logic, a respective digital-to-analog conversion (DAC) device for adjusting a phase of said sampling clock signal output received from said electronic phase rotator device.

6. The method of claim 1, wherein said on-chip generated phase reference pattern signal is a differential signal pair of reference pattern signals, each received at a respective input of a respective signal path, said correcting for said DCD comprising:
sensing, using a low pass filter, each said on-chip generated reference pattern signal to obtain a first average voltage level (Vpavg)) and a second average voltage level (Vnavg), said first Vpavg corresponding to a first signal of said differential pair and said second Vnavg corresponding to a second signal of said differential pair;
comparing, using a comparator circuit, a difference between said Vpavg and said Vnavg signals; and
responsive to said comparing, adjusting a setting of a respective digital-to-analog converter device located in each respective signal path associated with a respective signal of said differential pair of reference pattern signals.

7. The method of claim 2, wherein said on-chip generated phase reference pattern signal is a differential signal pair of reference pattern signals received at inputs of a respective signal path, each respective signal path including a respective pre-inverting digital-to-analog converter (pre-dac) device, said method correcting for said duty cycle distortion (DCD) comprising:
inputting each received reference pattern signal from respective pre-dac device outputs to a flip-multiplexor device configured to invert said on-chip generated phase reference pattern differential signals;
sensing, using a low pass filter, a non-inverted reference pattern signal output of said flip-multiplexor device, to obtain a first average voltage level (Vpavg)) and a second average voltage level (Vnavg), said first Vpavg corresponding to a first signal of said differential pair and said second Vnavg corresponding to a second signal of said differential pair;
comparing, using a comparator circuit, a difference between said first Vpavg and said second Vnavg signals; and
responsive to said comparing, correcting for said DCD error by adjusting a setting of a respective pre-inverting digital-to-analog converter (pre-dac) device located in each signal path;
storing a first pre-inverting dac setting when said DCD error is corrected;
inverting the received reference pattern signals through the flip-multiplexor device;
sensing, using a low pass filter, each said on-chip generated reference pattern signal output of said flip-multiplexor device to obtain a further first average voltage level (Vpavg)) and a further second average voltage level (Vnavg) for a respective signal of said differential pair;
comparing, using a comparator circuit, a difference between said further first Vpavg and said further second Vnavg signals; and
responsive to said comparing, correcting for said DCD error by adjusting a setting of a respective digital-to-analog converter (pre-dac) device located in each signal path;
storing a second pre-inverting dac setting when said DCD error is corrected;
averaging said first and second pre-inverting dac settings; and
setting each respective said pre-inverting digital-to-analog converter device using said average.

8. The method of claim 7, wherein a signal path of each signal of said differential pair at an output of the flip-multiplexor device path includes a corresponding post-inverting digital-to-analog converter (post-dac) device for receiving each respective reference pattern signal through the flip-multiplexor device, said correcting for said DCD error comprising:
sensing, using a low pass filter, a non-inverted reference pattern signal output of said flip-multiplexor device, to obtain another first average voltage level (Vpavg)) and another second average voltage level (Vnavg), said another first Vpavg corresponding to a first signal of said differential pair and said another second Vnavg corresponding to a second signal of said differential pair;
comparing, using a comparator circuit, a difference between said another first Vpavg and said another second Vnavg signals; and
responsive to said comparing, correcting for said DCD error by adjusting a setting of a respective post-inverting digital-to-analog converter (post-dac) device located in each corresponding signal path; and
storing a first post-inverting dac setting when said DCD error is corrected;
inverting the received reference pattern signals through the flip-multiplexor device;
sensing, using a low pass filter, each said reference pattern signal output of said flip-multiplexor device to obtain another further first average voltage level (Vpavg) and another further second average voltage level (Vnavg) for a respective signal of said differential pair;

comparing, using a comparator circuit, a difference between said another further first Vpavg and said another further second Vnavg signals; and responsive to said comparing, adjusting a setting of a respective digital-to-analog converter (post-dac) device;

storing a second post-inverting dac setting when said DCD error is corrected; and averaging said first and second post-inverting dac setting values; and setting each respective said post-inverting digital-to-analog converter device using said average.

9. The method of claim 5, further comprising:

adjusting the setting of a phase rotator device to modify a phase of a first sampling clock signal to align its samples to the edges of the reference output pattern signal; and concurrently adjusting the setting of said DAC device to modify a phase difference between the first and a second sampling clock signal by aligning said second sampling clock signal to a different edge of the reference output pattern signal.

10. The method of claim 9, wherein said adjusting phase sampling calibration of each said sampling clock signal using said phase calibration logic comprises:

a first adjusting of a setting of a digital-to-analog converter (dac) phase correction circuit located in a signal path associated with and receiving a sampling clock phase signal from the phase rotator device to span an error such that a processor device implementing phase calibration logic, detects one of: all early or all late phase clock sampler output values with respect to a data edge of a reference output signal, said reference output signal pattern of a non-inverting polarity;

a second adjusting a setting of said digital-to-analog converter (dac) phase correction circuit such that the phase calibration logic detects an equal number of early and late values from the phase clock sampler output;

recording said second digital-to-analog converter (dac) phase correction circuit setting as a first value;

a third adjusting a setting of the digital-to-analog converter (dac) phase correction circuit located in a signal path associated with a sampling clock phase signal from the phase rotator device to span an error such that the phase calibration logic detects an opposite condition of one of: all early or all late phase clock sampler output values with respect to said reference output signal data edge;

a fourth adjusting a setting of said digital-to-analog converter (dac) phase correction circuit such that the phase calibration logic detects an equal number of early and late values from the phase clock sampler output;

recording said fourth setting of said first digital-to-analog converter (dac) phase correction circuit as a second value;

computing an average of said recorded first and second phase correction circuit adjustment values;

inverting a polarity of a reference output signal pattern; and repeating said first adjusting and second adjusting, said first value recording, said third adjusting and fourth adjusting, said second value recording for said inverted reference output signal pattern;

computing an average of said recorded first and second phase correction circuit adjustment values for said inverted reference output signal pattern; and computing an average of the final values with inverted and non-inverted reference output signal patterns, wherein said final average value with inverted and non-inverted patterns is used as a final adjustment value for the clock phase correction.

11. An apparatus for calibrating sampling phases of a multi-phase sampling system, the apparatus comprising:

a reference pattern generator circuit for generating, on-chip, at least one phase reference pattern signal;

a correction circuit to correct for any duty cycle distortion (DCD) of each said at least one on-chip phase reference pattern signal, said at least one DCD corrected on-chip reference pattern signal being input to a data path, said data path providing at least one reference output pattern signal;

a sampling circuit responsive to a sampling clock signal to take samples of the at least one reference output pattern signal; and a processing circuit configured to modify a phase of said sampling clock signal to align said samples of said at least one reference output pattern signal taken by said sampling circuit to pattern edges thereof.

12. The apparatus of claim 11, further comprising:

an inverting device for periodically inverting the on-chip generated phase reference pattern signal within the reference pattern generator circuit, and performing a clock phase correction before and after the inverting, with averaging phase correction result values to cancel out errors due to a duty cycle distortion (DCD) in the at least one reference output pattern signal.

13. The apparatus of claim 11, further comprising:

an electronic phase rotator device for outputting a sampling clock signal for said sampling said at least one respective reference output pattern signal from said data path, wherein to modify a phase of said sampling clock signal to align its samples of said at least one reference output pattern signal to edges thereof, said processing circuit is configured to:

determine whether a latch of the sampling circuit is sampling before or after a zero-crossing; and, in response to said determining, adjust, using a phase calibration logic, a phase sampling calibration of each said sampling clock signal to align its sample to the zero crossing.

14. The apparatus of claim 13, further comprising:

a respective digital-to-analog conversion (dac) phase correction circuit coupled to the electronic phase rotator device for receiving a respective sampling clock phase signal, wherein to adjust a phase sampling calibration of a sampling clock signal, a processing device implementing said phase calibration logic is configured to:

adjust a setting of each respective dac phase correction circuit corresponding to each respective sampling clock phase signal output from the electronic phase rotator.

15. The apparatus of claim 11, wherein said on-chip generated phase reference pattern signal is a differential signal pair of reference pattern signals each received at a respective input of a respective signal path, said apparatus further comprising:

a respective digital-to-analog converter device located in a signal path associated with and receiving each said signal of said differential pair;

a low pass filter for sensing a respective each said on-chip generated reference pattern signal to obtain a first average voltage level (Vpavg)) and a second average voltage level (Vnavg), said first Vpavg corresponding to a first signal of said differential pair and said second Vnavg corresponding to the second signal of said differential pair;

a comparator circuit for comparing a difference between said Vpavg and said Vnavg signals; and
responsive to said comparing, said correction circuit adjusting a setting of each respective digital-to-analog converter device located in the respective signal path.

16. The apparatus of claim 12, wherein said on-chip generated phase reference pattern signal is a differential signal pair of reference pattern signals received at a respective input of a respective signal path, said apparatus further comprising:
a respective pre-inverting digital-to-analog converter (pre-dac) device located in a respective signal path associated with and receiving each said reference pattern signal of said differential pair;
said inverting device comprising a flip-multiplexor device configured to receive each reference pattern signal output from the respective pre-dac device and to invert said on-chip generated phase reference pattern differential signals;
a low pass filter to sense a non-inverted reference pattern signal output of said flip-multiplexor device to obtain a first average voltage level (Vpavg)) and a second average voltage level (Vnavg), said first Vpavg corresponding to a first signal of said differential pair and said second Vnavg corresponding to a second signal of said differential pair;
a comparator circuit for comparing a difference between said first Vpavg and said second Vnavg signals, said correction circuit responsively correcting for said DCD error by adjusting a setting of a respective pre-inverting digital-to-analog converter (pre-dac) device located in each signal path;
a memory storage device for storing a first pre-inverting stage dac setting when said DCD error is corrected; and
wherein when said flip-multiplexor device inverts the received reference pattern signals,
said low pass filter senses each said on-chip generated reference pattern signal output of said flip-multiplexor device to obtain a further first average voltage level (Vpavg)) and a further second average voltage level (Vnavg) for a respective signal of said differential pair;
said comparator circuit compares a difference between said further first Vpavg and said further second Vnavg signals;
said correction circuit responsively corrects for said DCD error by adjusting a setting of a respective digital-to-analog converter (pre-dac) device located in the signal path; and
said memory storage device stores a second pre-inverting dac setting when said DCD error is corrected; and
said correction circuit averages said first and second pre-inverting dac settings and sets each respective said pre-inverting digital-to-analog converter device using said average.

17. The apparatus of claim 16, further comprising:
a respective post-inverting digital-to-analog converter (post-dac) device located in a signal path at an output of the flip-multiplexor device for receiving each respective reference pattern signal through the flip-multiplexor device;
said low pass filter further sensing a non-inverted reference pattern signal output of said flip-multiplexor device to obtain another first average voltage level (Vpavg)) and another second average voltage level (Vnavg), said another first Vpavg corresponding to a first signal of said differential signal pair and said another second Vnavg corresponding to a second signal of said differential pair;
said comparator circuit comparing a difference between said another first Vpavg and said another second Vnavg signals, said correction circuit responsively correcting for said DCD error by adjusting a setting of a respective post-inverting digital-to-analog converter (post-dac) device located in each corresponding signal path; and
said memory storage device storing a first post-inverting dac setting when said DCD error is corrected; and
wherein when said flip-multiplexor device inverts the received reference pattern signals,
said low pass filter senses each said on-chip generated reference pattern signal output of said flip-multiplexor device to obtain another further first average voltage level (Vpavg)) and another further second average voltage level (Vnavg) for a respective signal of said differential pair;
said comparator circuit compares a difference between said another further first Vpavg and said another further second Vnavg signals;
said correction circuit responsively corrects for said DCD error by adjusting a setting of a respective digital-to-analog converter (post-dac) device in a respective signal path of said differential signal pair;
said memory storage device stores a second post-inverting dac setting when said DCD error is corrected; and
said correction circuit averages said first and second post-inverting dac settings and sets each respective said post-inverting digital-to-analog converter device using said average.

18. The apparatus of claim 14, wherein said phase calibration logic used to adjust said phase sampling calibration is configured to:
adjust the setting of a phase rotator device to modify a phase of a first sampling clock signal to align its samples to the edges of the reference output pattern signal; and
concurrently adjust the setting of said DAC device to modify a phase difference between said first sampling clock signal and a second sampling clock signal by aligning said second sampling clock signal to a different edge of the reference output pattern signal.

19. The apparatus of claim 18, wherein to adjust a phase sampling calibration said processing circuit is further configured to:
first adjust a setting of a first digital-to-analog converter (dac) phase correction circuit located in a signal path associated with and receiving a sampling clock phase signal from the phase rotator device to span an error such that the CDR logic detects one of: all early or all late phase clock sampler output values with respect to a data edge of a reference output signal, said reference output signal pattern of a non-inverting polarity;
second adjust a setting of said digital-to-analog converter (dac) phase correction circuit such that the phase calibration logic detects an equal number of early and late values from the phase clock sampler output;
record said second setting of said digital-to-analog converter (dac) phase correction circuit as a first value;
third adjust a setting of a digital-to-analog converter (dac) phase correction circuit located in a signal path associated with a sampling clock phase signal from the phase rotator device to span an error such that the phase calibration logic detects an opposite condition of one of: all early or all late phase clock sampler output values with respect to said reference output signal data edge;
fourth adjust a setting of said digital-to-analog converter (dac) phase correction circuit such that the phase calibration detects an equal number of early and late values from the phase clock sampler output;

record said fourth setting of said first digital-to-analog converter (dac) phase correction circuit as a second value;

compute an average of said recorded first and second phase correction circuit adjustment values;

invert a polarity of a reference output signal pattern; and repeat said first adjusting and second adjusting, said first value recording, said third adjusting and fourth adjusting, said second value recording for said inverted reference output signal pattern;

compute an average of said recorded first and second phase correction circuit adjustment values for said inverted reference output signal pattern; and compute an average of the final values with inverted and non-inverted reference output signal patterns, wherein said final average value with inverted and non-inverted patterns is used as a final adjustment value for the clock phase correction.

* * * * *